United States Statutory Invention Registration [19]

[11] Reg. Number: H96

Taylor [45] Published: Aug. 5, 1986

[54] INTENSITY MODULATED LIGHT SOURCE

[75] Inventor: Henry F. Taylor, Alexandria, Va.

[73] Assignee: United States of America, Washington, D.C.

[21] Appl. No.: 417,826

[22] Filed: Sep. 13, 1982

[51] Int. Cl.[4] ..... H03K 13/02; G02B 5/14; G02B 5/174

[52] U.S. Cl. ..... 332/7.51; 356/349

[58] Field of Search ..... 332/7.51; 356/349; 350/6.2, 96.12-96.14; 455/611; 370/3

[56] References Cited

U.S. PATENT DOCUMENTS

| | | | |
|---|---|---|---|
| 2,385,086 | 9/1945 | D'Agostino et al. | 250/225 |
| 3,175,088 | 3/1965 | Herriott | 455/614 |
| 3,302,027 | 1/1967 | Fried et al. | 356/349 |
| 3,393,955 | 7/1968 | Sterzer | 372/91 |
| 3,586,416 | 6/1971 | De Bitetto | 350/356 |
| 3,656,853 | 4/1972 | Bagley et al. | 356/349 |
| 3,790,898 | 2/1974 | Gudmundsen et al. | 356/349 |
| 4,070,094 | 1/1978 | Martin | 350/96.14 |
| 4,188,096 | 2/1980 | Shajenko | 350/358 |
| 4,265,122 | 5/1981 | Cook et al | 367/140 |
| 4,266,850 | 5/1981 | Burns | 350/96.14 |
| 4,288,785 | 9/1981 | Papuchon et al. | 350/96.14 |
| 4,320,475 | 3/1982 | Leclerc | 350/96.14 |
| 4,340,272 | 7/1982 | Papuchon | 350/96.14 |
| 4,363,114 | 12/1982 | Bucaro et al 367 | 149/ |
| 4,417,815 | 11/1983 | Murray et al. | 356/349 |
| 4,447,116 | 5/1984 | King | 350/96.13 |

OTHER PUBLICATIONS

Shajenko et al, "Signal Stabilization . . . ", 6/15/80, pp. 1895-1897, Appl. Opt., vol. 19, #12.

Jarzynski et al, "Frequency Response . . . ", 6/81, pp. 1799-1808, J. Acoust. Soc. Am., vol. 69, #6.

Goldberg et al, "Microwave Signal . . . Technique", 4/15/82, pp. 317-319, Elect. Lett. vol. 18, #8.

Seito et al., Optical FSK Heterodyne . . . Oscillation", 1981, pp. 935-941, IEEE J. Quant. Elec., vol. QE-17.

Palma et al, "Two-Wavelength Phase Control", 4/20/79, pp. 116-121, SPIE, vol. 179, Adapt. Opt. Conf. II.

*Primary Examiner*—Nelson Moskowitz

*Attorney, Agent, or Firm*—Robert F. Beers; William T. Ellis

[57] ABSTRACT

A device for producing intensity-modulated light over a broad frequency range comprising a frequency tunable light soruce, a control line for controlling the frequency of the light source to provide a first frequency at a first time and a second frequency at a second time, and an interferometer with a differential path length. The interferometer functions to recouple the light frequencies after propagating along different interferometer paths to effect a frequency beating. The resulting beat frequency is the intensity-modulated light.

12 Claims, 6 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

INTENSITY MODULATED LIGHT SOURCE

BACKGROUND OF THE PRESENT INVENTION

The present invention relates generally to light modulators, and more particularly, to light modulators capable of generating microwave-frequency light signals.

Present techniques for producing modulation of light generally make use of a controlled variation in the electrical signal energy supplied to the light source, or make use of electrooptic or acoustooptic interactions with light from a continuously emitting source. The maximum modulation frequency presently obtainable with these methods is a few gigahertz at best, and such modulation rates in the gigahertz range require significant driving circuits and microwave packaging. Thus, the cost size, electrical power dissipation, and complexity increase rapidly for modulation frequencies above approximately 100 MHz. By way of example, it is estimated that a source of modulated light with a 1 GHz bandwidth using state-of-the-art technology would cost more than $10,000, require an electrical drive power in excess of 10 watts, and contain dozens of electronic and optoelectronic components. It has been suggested to interfere or beat the light from two lasers to produce high frequency intensity modulation at the difference frequency. However, it is difficult to stablize the laser frequencies to a degree adequate to insure high spectral purity and low FM noise in the beat signal. In this regard, see the article "Optical FSK Heterodyne Detection Experiments Using Semi-Conductor Laser Transmitter and Local Oscillation", by S. Saito, Y. Yamamoto, and T. Kimura, IEEE J. Quantum Electronics, 1981, QE-17, pages 935–941.

OBJECTS OF THE INVENTION

Accordingly, it is an object of the present invention to provide a simple and potentially inexpensive technique for producing intensity modulation of light over a broad range of frequencies in the radio frequency and microwave bands.

It is a further object of the present invention to provide an intensity modulating device which contains only a few inexpensive solid state components and has a tunability range in the tens of gigahertz.

Other objects, advantages, and novel features of the present invention will become apparent from the detailed description of the invention, which follows the summary.

SUMMARY OF THE INVENTION

The present invention describes a method and a means for generating intensity modulated light by causing the frequency of a light source to vary with time and then interfering that light with light emitted by the same light source at a different point in time.

Briefly, the present device for producing intensity modulated light over a broad frequency range comprises a frequency-tunable light source, circuitry for controlling the frequency of the light source with time in a desired manner, and an interferometer disposed to receive the frequency varying light emitted from the light source and to interfere that light with light emitted from the light source at a different time, resulting in an intensity modulated light signal at the beat frequency of the interfering light.

The interferometer may be realized in one embodiment by a Mach-Zehnder interferometer using either partially reflecting mirrors as beamsplitter couplers and air as the propagating medium, or using one or more evanescent-field fiber optic beamsplitter couplers with optical fibers for the propagation paths. In a second embodiment the interferometer may be realized with a four-port fiber coupler having a fiber coil connected between one input and one output port.

BRIEF DESCRIPTION OF THE DRAWINGS

FIG. 4(*b*) is a frequency versus time graph showing the generation of a single-frequency pulse from a step increase in the laser input frequency.

FIG. 4(*c*) is a frequency versus time graph showing the generation of two single-frequency pulses from a step pulse in the input laser frequency.

FIG. 4(*d*) is a frequency versus time graph showing the generation of a chirped output from a non-linear chirped laser input.

DETAILED DESCRIPTION OF THE PREFERRED EMBODIMENT

Figure 1:
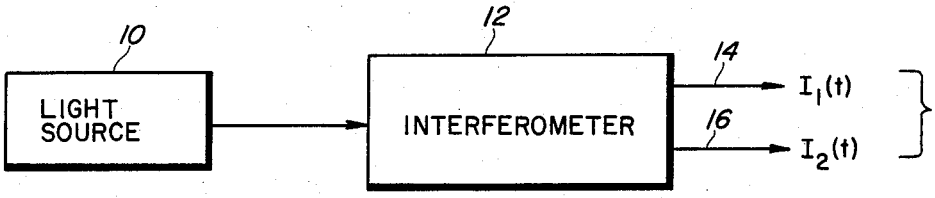
FIG. 1 is a schematic block diagram of the intensity-modulated light source of the present invention.

As noted above, the present invention describes a method and a means for generating intensity-modulated light by causing the frequency of the a light source to vary with time and then interfering, or beating, light from that light source with light emitted from the same light source at a different point in time. Referring now to the drawings, wherein like reference characters designate like or corresponding parts throughout the views, FIG. 1 shows the present invention in its most basic configuration. Therein, a light source 10, which is capable of being tuned in frequency over time, is coupled into an interferometer 12 with unequal optical path lengths. If the temporal variation in laser frequency is described by the function v(t), then the optical output beams from the interferometer are intensity modulated at the beat frequency $f_b$ of the two interfering beams, given by the equation $f_b(t)=\nu(t-T_1)-\nu(t-T_2)$, where $T_1$ and $T_2$ are the time delays for the optical paths in the interferometer 12. It can be seen that the output $I_1(t)$ on line 14 and the output $I_2(t)$ on line 16 will have the following variation:

$$I_1(t)=C_1+C_2\cos(F_b t+\phi)$$

$$I_2(t)=C_1+C_2\cos(F_b t+\phi)$$

where $C_1$, $C_2$, and $\phi$ are constants.

Figure 2:
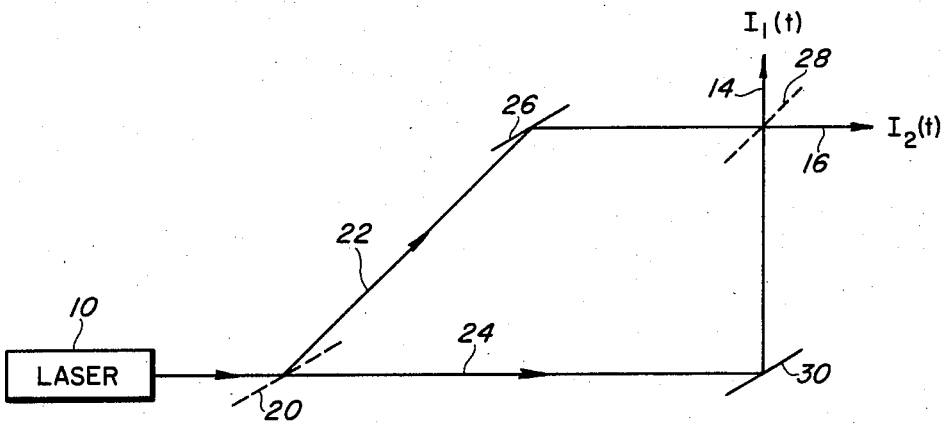
FIG. 2 is a schematic diagram of one embodiment of the intensity-modulated light source using partially reflecting mirrors as beamsplitters and air as the propagation medium.

The basic device shown in FIG. 1 may be implemented in a variety of configurations. FIG. 2 shows one such configuration wherein the light source 10 is implemented by a laser and the interferometer 12 is implemented by a Mach-Zehnder interferometer. A Mach-Zehnder interferometer typically comprises two optical beamsplitter couplers. The first beamsplitter divides the input optical power into two beams which traverse optical paths of different lengths. The second beamsplitter then recombines the beams to produce a beat signal. In FIG. 2 the Mach-Zehnder interferometer comprises series of reflecting and partially reflecting mirrors with air as the propagation medium. The light from the laser source 10 is directed at a first partially reflecting mirror 20 which acts to split the light beam to propagate along two paths 22 and 24. One of these light paths is significantly longer than the other path, although this has not been represented in FIG. 2 for purposes of convenience. The light path 22 includes a mirror 26 for reflecting the light propagating thereon to one side of a partially reflecting mirror 28. Likewise, the path 24 contains a mirror 30 for reflecting the light propagating on this path to the other side of the partially reflecting mirror 28. The partially reflecting mirror 28 acts to recombine and mix the beams to yield the modulated signals $I_1$ (t) on line 14 and $I_2$ (t) on line 16.

Figure 3:
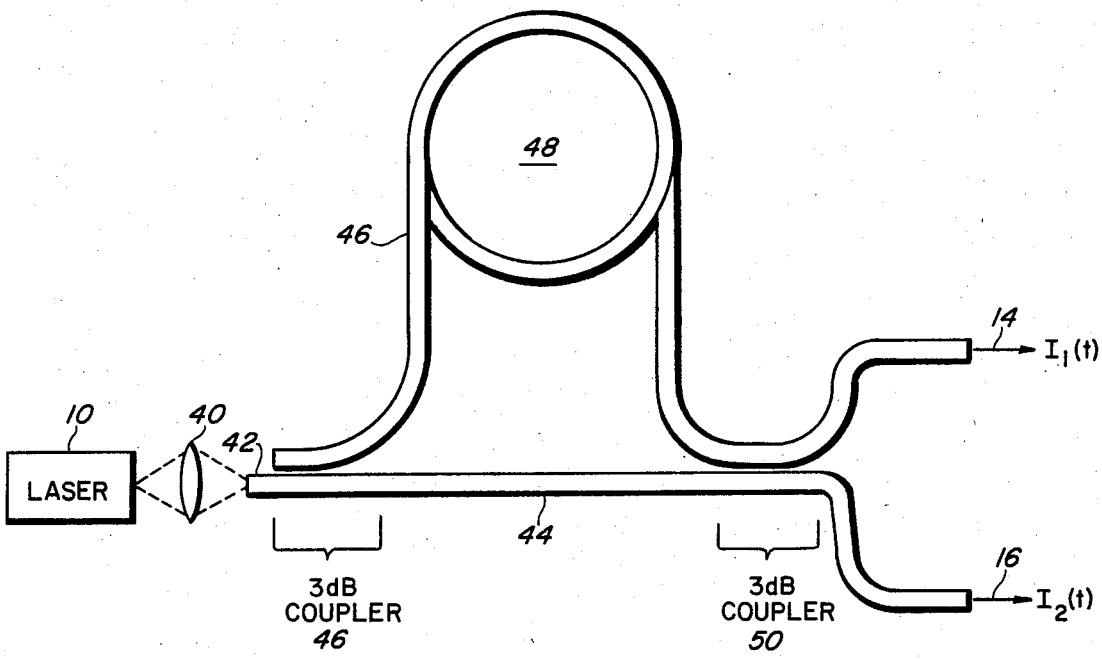
FIG. 3 is a schematic diagram of a second embodiment of the intensity-modulated light source with evanescent-field fiber optic 3 dB couplers as beamsplitters and optical fibers as the propagation paths.
Figure 4A:
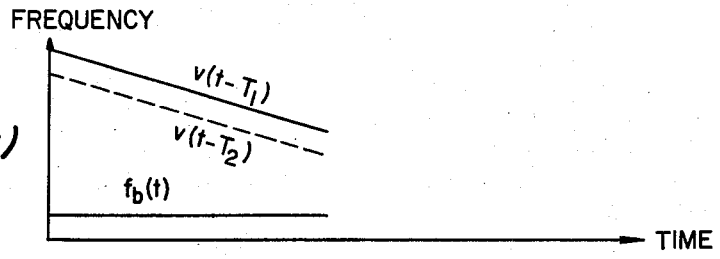
FIG. 4(*a*) is a frequency versus time graph illustrating the generation of a signal-frequency output by means of a linear-chirped laser input.
Figure 4B:
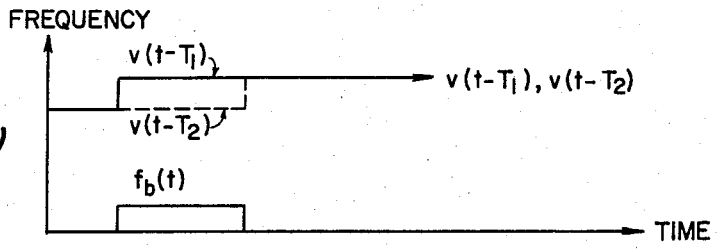
Figure 4C:
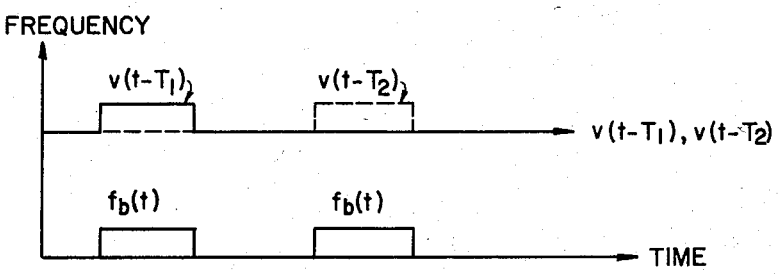
Figure 4D:
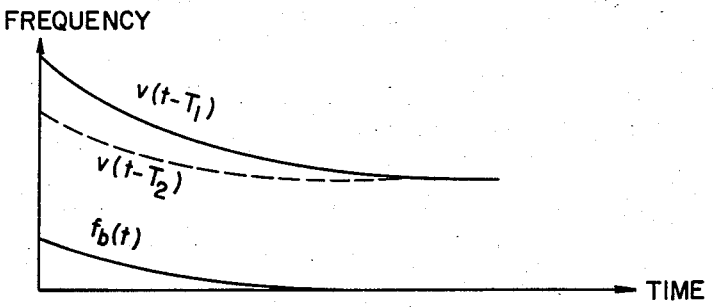

FIG. 3 shows a second configuration for the basic invention, Therein the interferometer is again realized by a Mach-Zehnder interferometer utilizing evanescant-field fiber optic beam splitters with optical fibers for the propagation paths. The light from a laser source 10 is directed to the input face 42 of an optical fiber 44 by means of a lens 40. The light propagating on this optical fiber 44 is then split into two beams by means of a 3 db coupler 46. This 3 db coupler 46 may be realized in the well-known manner simply by disposing a second optical fiber 46 in parallel proximity to the first optical fiber 44 in order to obtain evanescent-field coupling. Again, one of these two optical fiber paths 44 and 46 is significantly longer than the other. In FIG. 3, the optical fiber path 46 includes a coil 48 of fiber wound on a reel to make it the longer path. The optical fiber paths 44 and 46 are then bought into parallel proximity to form a second 3 db evanescent-field coupler 50 to mix the light propagating in these paths and thereby generate the light outputs $I_1$ (t) and $I_2$ (t) intensity modulated at the beat frequency $f_b$.

The optical laser source of FIG. 2 and FIG. 3 may be realized by any type of tunable laser such as, for example, a tunable dye laser, or a tunable semiconductor diode laser. Best performance will require the use of lasers which emit in a single mode to give a high degree of spectral purity. Spectral purity is desired in order to obtain a narrow laser line to control the width of the modulated beat frequency signal. The presently described process entails the beating of two spectra from the same laser together such that the convolution of the two waveforms will determine the spectral width of the beat frequency signal generated.

The semiconductor diode laser appears particularly attractive from a practical standpoint because of its small size, low cost, high electrical-to-optical conversion frequency, and rapid tunability over a wide range of frequencies. Frequency tuning of the diode laser can be accomplished by varying the ambient or heat-sink temperature or by varying the diode current. It is noted that a typical semiconductor diode laser in thermal equilibrium with its heat sink changes in frequency at a rate of about 1 GHz per mA change in current. Thus, this statistic gives some idea of the magnitude of the tuning which can be obtained by varying the current to the diode. As an example, it can be seen that only a 10 mA change in driving current is required to obtain a 10 GHz frequency change in the intensity modulation of the interferometer output.

A wide variety of single-frequency, chirped, pulsed, and frequency hopping waveforms can be obtained, depending on the temporal variation in the laser frequency. Some of these waveforms are illustrated in FIG. 4. More specifically, in FIG. 4(*a*), there is shown the generation of a single frequency output $f_b$ (t) by means of a linear-chirped laser input. In FIG. 4(*b*) the generation of a single-frequency pulse $f_b$ (t) is shown by means of a step increase in the input laser frequency. In FIG. 4(*c*) the generation of two single-frequency pulses is illustrated by means of a step pulse in the input laser frequency. In FIG. 4(*d*) the generation of a chirped output signal is illustrated by means of a non-linear chirped laser input.

Figure 5:
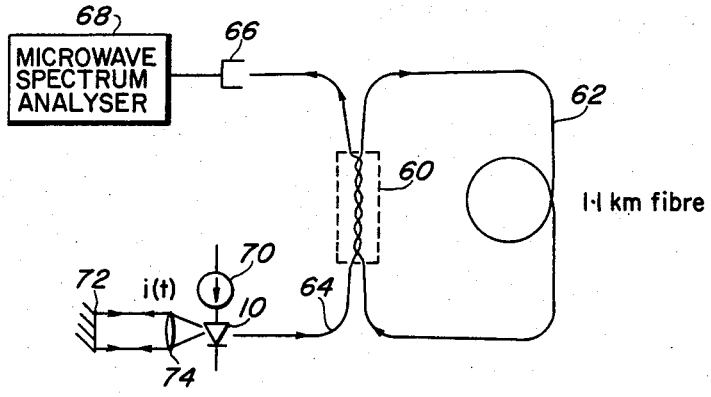
FIG. 5 is a third embodiment of the modulated light source of the present invention utilizing a single four-port coupler and fiber optic light paths.
Figure 6A:
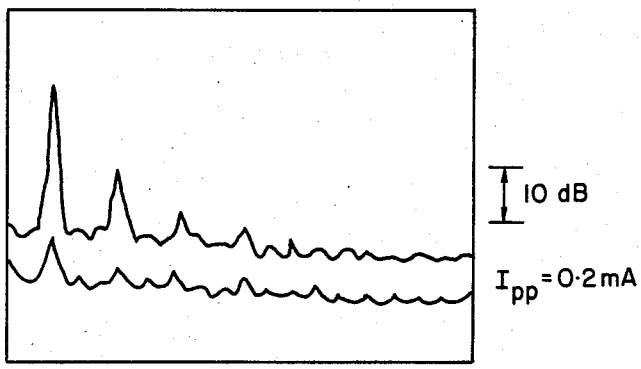
FIGS. 6(*a*), (*b*) (*c*) and (d) are drawings of photographs of a spectrum analyser display of the output beat signal as a function of Ip-p from 0.2 mA through 1.8 mA.
Figure 6B:
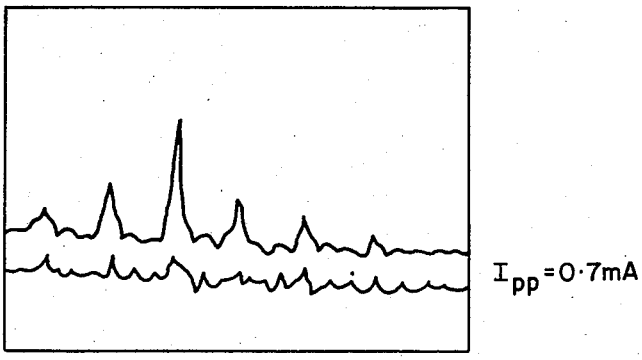
Figure 6C:
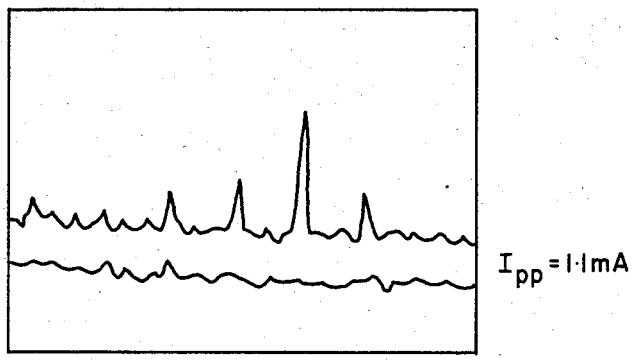
Figure 6D:
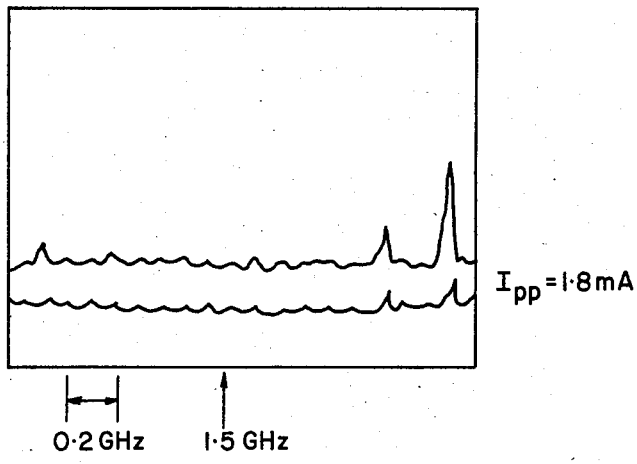

An experimental set-up for the device is shown in FIG. 5 and comprises a third embodiment of the present invention. This configuration comprises a laser diode 10 as the light source and a four-port evanescent-field fiber coupler 60 in combination with a length of single-mode fiber 62 as the interferometer. The length of optical fiber utilized in the experiment was 1.1 km which provided a 5.5 us time delay. The device is connected as follows. Light from the laser diode 10 is applied via an optical fiber 64 into one of the input ports of the coupler 60. The length of optical 62 is connected between one of the output ports of the coupler 60 and the second of its input ports. Thus, light from the laser injected into the first input port is coupled into both output ports such that part of the laser light propagates through the optical fiber 62. After propagation through the fiber 62, the light enters the second input port of the coupler 60, where it mixes with the undelayed emission from the laser applied on the optical fiber 64. Light from the other output port of the coupler 60 is focused in the experiment onto a photodetector 66, which may be realized by a silicon avalanche photodiode with a response bandwidth of 2 Ghz. The photodiode 66 produces an electrical signal at the difference frequency for the delayed and undelayed laser emission. The microwave spectrum of this difference frequency was then observed on a Hewlett Packard spectral analyzer 68.

It should be noted that a beat frequency component will also be coupled back into the fiber coil 62. However, this beat frequency component will be significantly weaker than the most recently coupled signal propagating therein due to attenuation of the beat signal in the optical fiber and in the four-port coupler 10. This beat frequency component is not present in the Mach-Zehnder interferometer configurations of FIG. 2 and FIG. 3.

In the experiment actually performed, a single mode CSP GaAlAs laser diode with a dc bias current 20–30 percent above threshold was used as the laser source. Frequency tuning of the laser was accomplished by superimposing a time-varying current I(t) 70 through a bias tee. Time-dependent changes in the emission frequency v(t) of a laser operating under various modulating conditions are shown in the article "Microwave Signal Generation Using An Optical Self-Heterodyne Technique" by L. Goldberg, J. F. Weller, H. F. Taylor, Electronics Letters, Apr. 15, 1982, Vol. 18, No. 8, pages 317–319. Frequency tuning in the laser diode is due to both changes in carrier density and in the laser diode temperature, with the thermal effect dominant for times greater than 100 ns after the beginning of a current pulse.

As noted above, to obtain a spectrally narrow microwave signal with low FM noise, the laser emission line width should be small. Also, the center frequency should be constant over most of the current modulation cycle. To narrow the laser emission line width, optical feedback from an optical cavity is used. In the embodiment shown in FIG. 5, a mirror 72 is located 60 centimeters from the laser facet in order to provide a feedback signal on the order of $10^{-4}$. A lens 74 is utilized to focus the light from the laser diode on to the feedback mirror 72. This feedback causes the laser line to narrow considerably and the center frequency to vary in stepwise fashion as a function of current. The time dependence of the frequency for a square-wave modulated laser operating with feedback is shown in FIG. 2(*b*) of the aforementioned Goldberg article. Discrete jumps of 250 MHz corresponding to the frequency spacing of the external modes given by C/2L, were observed. Between these jumps, the emission frequency remained relatively constant. To achieve more abrupt transitions in v(t), prebias pulses may be superimposed on the square wave so that the laser temperature and emission frequency are brought to their equilibrium levels more quickly. With the addition of feedback, the v(t) of the laser more closely approaches the ideal square-wave pattern.

The actual output of the microwave spectrum analyzer 68 is shown in FIG. 6. A square-wave at 0.5 GHz is used as the modulating waveform with a period of 11.0 μs. The prepulse amplitude and length 10 were $I_{p-p}$ and 0.3 μs, respectively. The spectrum analyzer display of FIG. 6 indicates that the diode photodetector output occurs in a single dominant peak $v_0$, and with smaller signals at $v_0 \pm 250$ MHz. These additional peaks are due to the fact that in the presence of feedback the laser emission spectrum contains several weak external cavity modes in addition to the single dominant mode. By changing the $I_{p-p}$, the $v_0$ is tuned at a rate of 1.0 GHz/mA. Since with feedback the laser emission frequency varies in a stepwise fashion as a function of current, only integral multiples of 250 MHz are observed in the photodetector output signal.

In conclusion, a simple technique for obtaining optical beat signals at microwave frequencies using a tuned diode laser has been disclosed. A narrow microwave spectrum may be obtained by feeding a portion of the laser emission back into the cavity. With proper current tuning, it should not be difficult to obtain modulation at several tens of gigahertz by this technique.

The primary advantages of the present intensity modulation technique include low cost, small size, low electrical power dissipation, and broad frequency tuning range. Applications of this technique are foreseen in transmitters for optical fiber communications and in the generation of microwave signals for radar and electronic warfare. In communications, the intensity modulated light source would be an ideal FM transmitter for either analog or digital transmission, since the modulation could be accomplished with milliwatt changes in electrical current. An equivalent system with conventional components would require complex and expensive oscillators and switches, and dissipate orders of magnitude more electrical power.

It is also noted that when a photodetector is used with this device, the optical signal generated thereby can be converted to a microwave signal, which can then be amplified and transmitted. The frequency of the intensity modulated source can be varied over tens of gigahertz in times much less than one microsecond, thereby providing a versatile technique for producing complex chirped, pulsed, and frequency hopping waveforms for radar transmitters and for jamming enemy signals in electronic warfare.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A device for producing intensity modulated light over a broad frequency range comprising:

a frequency-tunable light source;

a control line for varying the frequency of said light source with time in a desired manner such that light of a first frequency $f_1$ is provided by said light source at a first time and light of a second frequency $f_2$, different from said first frequency, is provided by said light source at a second time; and an interferometer with different optical path lengths disposed to receive said first frequency light from said light source and to interfere that light with said second frequency light emitted from said light source at said second time, resulting in an intensity modulated light signal at the beat frequency of $|f_1 - f_2|$.

2. A device as defined in claim 1, wherein said light source is a tunable laser.

3. A device as defined in claim 2, wherein said interferometer is an Mach-Zehnder interferometer comprising:

a first optical path;

a second optical path with a longer optical length length then said first optical path;

a first beamsplitter for splitting the light beam from said light source to propagate along said first and second optical paths; and a second beamsplitter for combining the beams after they have traversed said first and second optical paths to yield a resultant intensity modulated light signal.

4. A device as defined in claim 2, wherein said interferometer is a Mach-Zehnder interferometer comprising:

a first optical fiber path;

a second optical longer fiber path with a longer length then said first optical fiber path;

a first 3 dB coupler for coupling light from said light source into said first and second optical fiber paths; and a second 3 dB coupler for coupling the light after propagating through said first and second optical fiber paths to yield a resultant intensity modulated light signal.

5. A device as defined in claim 2, wherein said interferometer comprises:

a four-port evanescant field fiber coupler with an input first port connected to said light source, with an output third port connected to an output line; and an optical fiber coil connected between an input second port and an output fourth-port of said four-port fiber coupler.

6. A device as defined in claim 5, further comprising a transducer connected to the output line for converting light propagating on said output line to an electrical signal at the beat frequency of the interfering beams.

7. A method of generating intensity-modulated light over a broad frequency range comprising the steps of:

temporally varying the frequency of a light source in a predetermined manner to yield a first frequency $f_1$ at a first time and to yield a second frequency $f_2$, different from $f_1$, at a second time; and interfering the light at frequency $f_1$ emitted from the light source at said first time with the light at frequency $f_2$ emitted from the light source at said second time to yield an intensity modulated light signal at the beat frequency of the interfering light.

8. A method as defined in claim 7, wherein said interfering step comprises the steps of;

splitting the light emitted from the light source into two beams which propagate on different paths;

delaying the light propagating on one path relative to the other path; and coupling the light on the two differentially delayed paths together to yield a resultant light output.

9. A device as defined in claim 3, wherein said frequency-tunable light source laser includes means for applying a prebias pulse to said laser so that the laser temperature and emission frequency are brought to their equilibrium levels quickly.

10. A device as defined in claim 4, wherein said frequency-tunable light source laser includes means for applying a prebias pulse to said laser so that the laser temperature and emission frequency are brought to their equilibrium levels quickly.

11. A device for producing intensity-modulated light over a broad frequency range, comprising:

a single frequency-tunable laser;

a control line for varying the frequency of said laser with time to obtain light of a first frequency $f_1$ at a first time and light of a second frequency $f_2$, different from said first frequency, at a second time;

delay means for delaying light of said first frequency emitted from said single laser at said first time; and mixing means for mixing the delayed light of said first frequency from said delay means with said light of said second frequency obtained directly from said single laser, resulting in an intensity-modulated beat signal.

12. A device as defined in claim 11, wherein said frequency-tunable light source laser includes means for applying a prebias pulse to said laser so that the laser temperature and emission frequency are brought to their equilibrium levels quickly.

* * * * *